United States Patent
Olszak et al.

(10) Patent No.: US 6,958,464 B2
(45) Date of Patent: Oct. 25, 2005

(54) EQUALIZATION FOR A MULTI-AXIS IMAGING SYSTEM

(75) Inventors: Artur G. Olszak, Tucson, AZ (US); Chen Liang, Tucson, AZ (US)

(73) Assignee: DMetrix, Inc., Tucson, AZ (US)

(*) Notice: Subject to any disclaimer, the term of this patent is extended or adjusted under 35 U.S.C. 154(b) by 0 days.

(21) Appl. No.: 10/666,445

(22) Filed: Sep. 19, 2003

(65) Prior Publication Data

US 2004/0056177 A1 Mar. 25, 2004

Related U.S. Application Data

(63) Continuation-in-part of application No. 10/158,633, filed on May 30, 2002.

(51) Int. Cl.$^7$ .................................................. G01J 1/32
(52) U.S. Cl. .................................... 250/205; 250/208.1
(58) Field of Search .......................... 250/208.1, 208.2, 250/205; 382/274

(56) References Cited

U.S. PATENT DOCUMENTS

| | | | |
|---|---|---|---|
| 4,407,008 A | | 9/1983 | Schmidt et al. ............... 348/79 |
| 4,879,250 A | | 11/1989 | Chan ........................... 438/24 |
| 5,051,574 A | * | 9/1991 | Yoshida et al. ............. 250/221 |
| 5,055,894 A | | 10/1991 | Chan ........................... 257/85 |
| 5,260,826 A | | 11/1993 | Wu ............................ 359/368 |
| 5,443,164 A | * | 8/1995 | Walsh et al. ................ 209/580 |
| 5,801,763 A | * | 9/1998 | Suzuki ........................ 348/77 |
| 5,970,164 A | * | 10/1999 | Bamberger et al. ......... 382/128 |
| 6,133,986 A | | 10/2000 | Johnson ....................... 355/67 |
| 6,320,174 B1 | | 11/2001 | Tafas et al. ............... 250/208.1 |
| 6,373,978 B1 | | 4/2002 | Ishihara ..................... 382/154 |
| 6,392,752 B1 | | 5/2002 | Johnson ...................... 356/511 |
| 6,577,775 B1 | * | 6/2003 | Li ............................. 382/274 |

FOREIGN PATENT DOCUMENTS

GB 2351556 A 4/2000 .......... G01N/21/64

OTHER PUBLICATIONS

Hans J. Tiziani and Hans–Martin Uhde, "Three–dimensional analysis by a microlens–array confocal arrangement," Applied Optics, Feb. 1, 1994, vol. 33, No. 4, pp. 567–572.

M. Eisner, N. Lindlein, and J. Schwider, "Confocal microscopy with a refractive microlens–pinhole array" Optics Letters, May 15, 1998, vol. 23, No. 10, pp. 748–749.

* cited by examiner

*Primary Examiner*—Thanh X. Luu
(74) *Attorney, Agent, or Firm*—Birdwell & Janke, LLP

(57) ABSTRACT

An imaging system with an integrated source and detector array. A plurality of light detectors are arranged in an array and a corresponding plurality of light sources are arranged in an array in an epi-illumination system so that light radiated from a point on the object illuminated by a given source is detected by a corresponding detector. An optical system is disposed so as to illuminate an object with light from the source array and image the object on the detector array. Ordinarily, the sources and detectors are coplanar and, preferably, are fabricated or at least mounted on the same substrate. In one embodiment the Airy pattern of the point response of the optical system encompasses both a detector and corresponding light sources. In another embodiment, the optical pathway is split by a diffractive element to produce conjugate points corresponding to light sources and their respective detectors. In a further embodiment, the pathway is split by a Wollaston prism. In yet another embodiment where the illumination and image light have different wavelengths, the pathway is split by dispersion. Another embodiment comprises a power supply connected to the plurality of light sources, a signal conditioning circuit for receiving and digitizing output signals from the light detectors so as to produce a respective set of output values, and an equalizing system for equalizing the output values for a given input radiance.

1 Claim, 18 Drawing Sheets

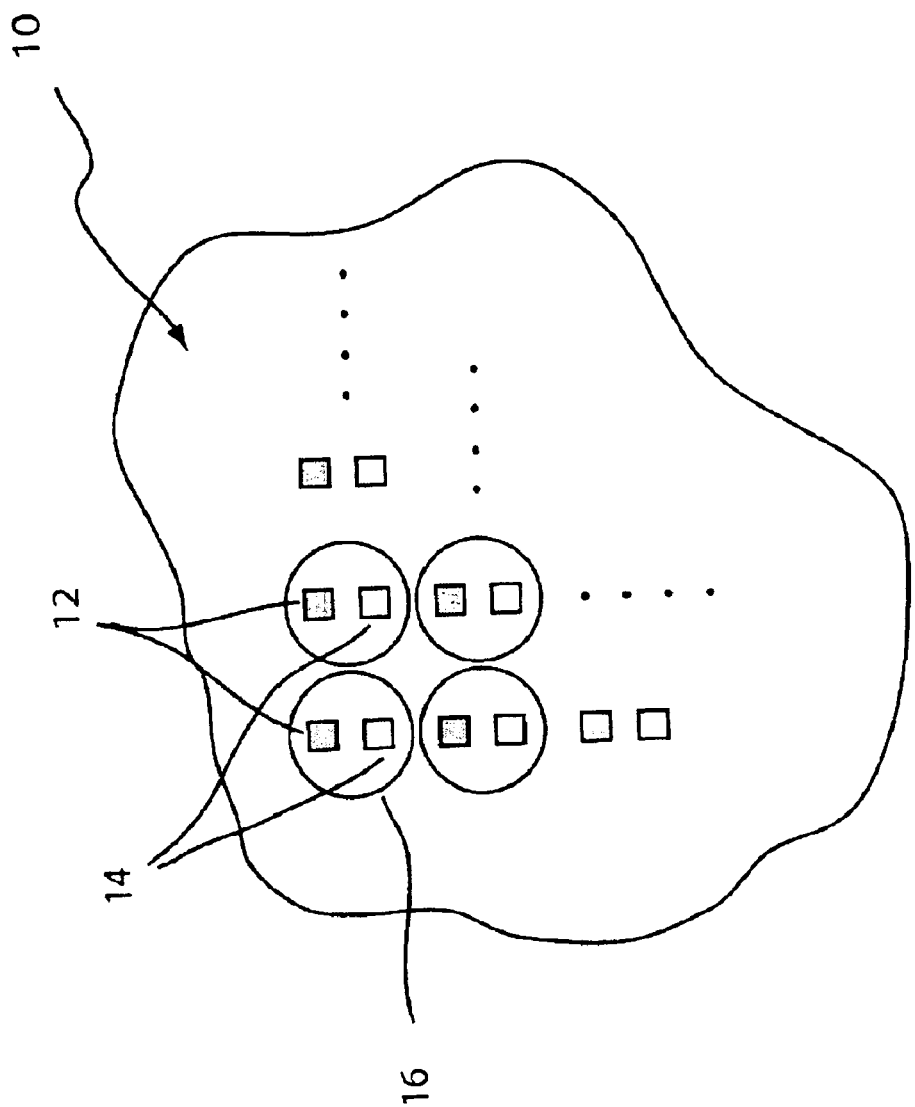

EQUALIZATION FOR A MULTI-AXIS IMAGING SYSTEM

This application is a continuation-in-part of U.S. patent application Ser. No. 10/158,633, filed May 30, 2002, which is incorporated herein by reference in its entirety.

FIELD OF THE INVENTION

This invention relates to illumination for optical imaging systems, particularly to an integrated detector and source array for epi-illumination in an imaging system, and more particularly in miniature microscope arrays.

BACKGROUND OF THE INVENTION

In an imaging system, adequate and appropriate illumination of the object to be imaged is essential. There must be enough light provided to the object to permit a viewer or detector to discern features of the object in the image thereof. In addition, the manner in which the light is provided to the object makes a difference in what features can be detected and the contrast with which they are imaged.

The way in which illumination is provided is particularly important in a microscope. If the object is opaque, it must be illuminated so that the light used to form an image of the object is radiated from the same side of the object on which light illuminates the object. This type of illumination is known primarily as epi-illumination. In epi-illumination the light radiated from an object may be in the form of reflection, in which case the illumination light is modulated upon reflection from the object, or it may be in the form of fluorescence, in which case the illumination light induces fluorescent emission by the object at a different wavelength from the illumination light, as determined by the fluorescence characteristics of the object. The latter case is known as epi-fluorescence. The term "radiated" is used throughout this specification and the claims hereof to include reflection, scattering and fluorescence.

One type of epi-illumination is critical illumination. In this case, the light source is imaged into the object plane. This provides efficient illumination and a short illumination system, but requires that the light source provide uniform radiance. The light source is ordinarily disposed actually or virtually on the optical axis of the imaging lens.

In the foregoing it is assumed that the entire field of view of the imaging lens is simultaneously imaged. However, in a confocal microscope only discrete points in object space are imaged. This is accomplished by placing one or more "pinhole" stops at the image plane of the microscope matched to corresponding discrete points in the object plane, and scanning the object laterally, either by moving the object or the microscope, or moving the scanning beam through the microscope using, for example, scan mirrors. The light passed by the pinhole is detected and related to the object position as the scan occurs, and the output of the detector is used to produce an image of the object as a whole. In this case, light from the light source is focused to the point on the object plane that is currently imaged. This is typically accomplished by placing a beam splitter between the imaging lens and the image plane so as to pass image light to the image plane while reflecting source light from a virtual image plane created by the beam splitter along the optical axis of the microscope toward the object plane.

In classic optical instruments employing critical illumination, the image is detected by the human eye. In many modern optical instruments, the image is detected by a photo-sensitive device, typically an array of photodetectors. In confocal microscopy, the image is necessarily detected by a photodetector. While the use of electronic image detection offers electronic capture of an image and the possibility of reducing the size of an imaging system, effective, compact epi-illumination has remained a challenge.

The recent development of miniaturized microscope arrays presents new challenges for illumination. In a miniature microscope array a plurality of laterally-distributed optical imaging elements having respective longitudinal optical axes are configured to image respective sections of a common object, or a plurality of respective objects and disposed with respect to a common object plane, so as to produce images thereof at respective image planes. The individual lenses of this array are formed of small optical elements, or "lenslets," that place severe constraints on providing illumination. Indeed, the multiplicity of lenslets arranged in an array and the small dimensions of the array suggest that prior art epi-illumination techniques cannot be used. Yet, a principal application for miniature microscope arrays is to image specimens, such as biological microarrays for protein analysis, that are sufficiently opaque that transillumination cannot be used effectively.

In a miniaturized microscope array each of the microscopes has at least one, and ordinarily many, optical detectors associated therewith for producing an electrical representation of the image produced by the microscope. The detectors are most likely to be semiconductor optical detectors. Each microscope may also have an illumination source associated therewith.

The electrical output of a semiconductor optical detector in response to a given radiance depends on its responsivity as well as the amount of radiant flux that actually reaches the active area of the detector. Such detectors typically produce a DC offset component in their output due to dark current, as well as a signal that varies with the radiant flux received by the detector. The responsivities and DC offsets of detectors may vary from detector to detector, even though the detectors may be the same kind of device. Consequently, where multiple detectors are employed as in an array microscope, the respective detectors may produce different electrical output amplitudes and offsets, even when illuminated by the same radiant flux. Similarly, the output radiances of optical sources may vary from source to source, even though the sources may be the same kind of device and may experience the same input current or voltage. Consequently, where multiple sources are employed to provide illumination for respective detectors, the respective detectors may receive varying light radiances, all other things being equal. These variations in source radiance and detector responsivity and flux-dependent DC offset can create pixel-to-pixel brightness errors in the images produced by a microscope array.

Accordingly, there is a need for novel systems and methods for providing critical illumination in epi-illumination imaging systems employing electronic image detection, and for equalizing the response of an imaging system over the entire image to an object whose radiance response to a given irradiance is uniform over the entire object.

SUMMARY OF THE INVENTION

The present invention meets the aforementioned need by providing, in an imaging system, a plurality of light detectors arranged in a detector array and a plurality of light sources corresponding to detectors in the detector array, so that light radiated from a point on the object illuminated by a given source of the source array is detected by a corresponding detector of the detector array. An optical system is disposed with respect to the detector array and the source array so as to illuminate an object with light from the source array and image the object on the detector array. Corresponding detectors and sources are disposed in back of the optical system and preferably interspersed among one another. Ordinarily, the sources and detectors preferably are coplanar, and preferably are fabricated or at least mounted on the same substrate. One or more sources may have a plurality of corresponding detectors, and one or more detectors may have a plurality of corresponding sources.

In one embodiment the Airy pattern point response of the optical system encompasses both a detector and its corresponding light sources. In another embodiment, the optical pathway is split by a diffractive element to produce conjugate points coupled to sources and their respective detectors. In a further embodiment, the pathway is split by a Wollaston prism or other polarizing element. In yet another embodiment where the illumination and image light have different wavelengths, the pathway is split by dispersion. The system is particularly suited for fluorescence imaging, confocal microscopy and array microscopes.

Another embodiment of the invention comprises a power supply connected to a plurality of light sources for supplying power thereto, a signal conditioning circuit for receiving and digitizing output signals from a respective set of light detectors so as to produce a respective set of output values, and an equalizing system for equalizing a respective set of output values for a given amount of input power supplied thereto by said source. In one method, the equalizing system is adapted to add to one or more of the output values a respective error correction value so as to produce new respective values that are substantially equal for the given amount of input power. In another method the signal conditioning circuit includes a set of amplifiers corresponding to said set of said plurality of light detectors which apply gain to said output signals prior to digitization thereof, and the equalizing system provides correction signals to the amplifiers based on the output values so as to equalize the output values for the given amount of input power. The amplifiers or associated analog-to-digital ("A/D") converters may be adapted to adjust their gain and offset in response to the correction signals. In addition, the power supply may be adapted to supply to the plurality of light sources respective amounts of power that have definite relative magnitudes with respect to one another, and the equalizing system is adapted to equalize the output values taking into account the relative amounts of power supplied to the plurality of light sources.

What is meant by "equalization" herein is equalizing the response of the imaging system, including sources and detectors and, where appropriate, the electronic interface, over the entire image to an object whose signal response to a given object properties is uniform over the entire object. Then, an equalized image is one whose relative brightness values over the entire surface thereof depend on the corresponding surface radiance responses of the object, not on the source irradiance or detector responsivities or offsets.

Accordingly, it is a principal objective of the present invention to provide novel systems and methods for imaging and illumination in a multi-axis imaging system.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 1(a) is an axial view of a two-dimensional integrated source and detector array according to the present invention.

DETAILED DESCRIPTION OF THE INVENTION

In a modern imaging system having electronic image detection, the image is typically detected by an array of photodetectors disposed in the image plane of the imaging system. The array may be two-dimensional or one-dimensional. In any event, each photodetector is customarily the source of one pixel of data, though in the case of a color imaging system where one photodetector is provided for each color to be detected one pixel may have multiple photodetectors associated with it. The present invention employs such an array of photodetectors, an improvement being that light sources may be interspersed in the array among the photodetectors. In this case, each pixel has one or more light sources, as well as one or more photodetectors, associated with it. Preferably, the sources and detectors are coplanar and, preferably, fabricated or at least mounted on the same substrate; however, for some applications the sources and detectors may lie in different planes. While the light sources preferably are disposed between the detectors, the principles of the invention could also be applicable to situations where the sources and detectors overlap or even lie substantially on the same axis.

Figure 1B:
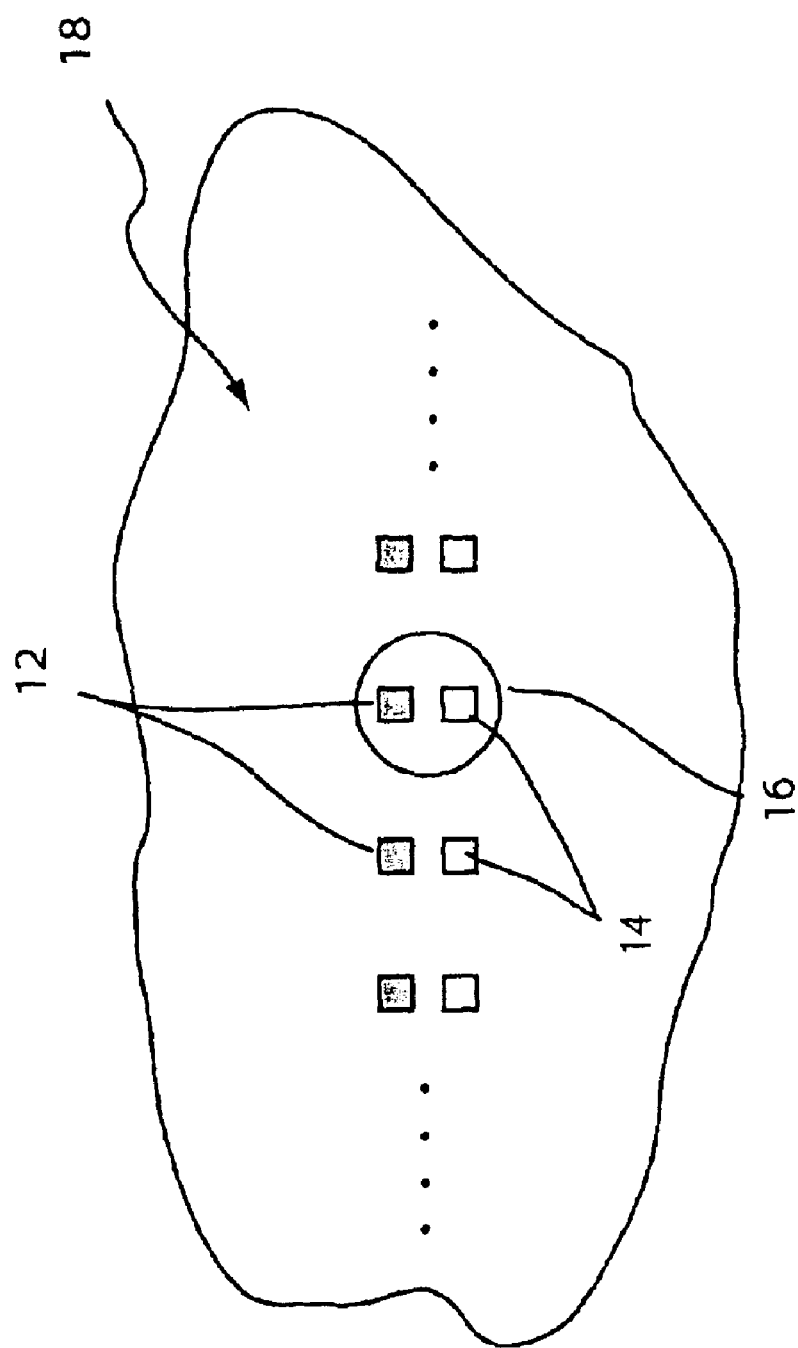
FIG. 1(b) is an axial view of a one-dimensional integrated source and detector array according to the present invention.
Figure 1C:
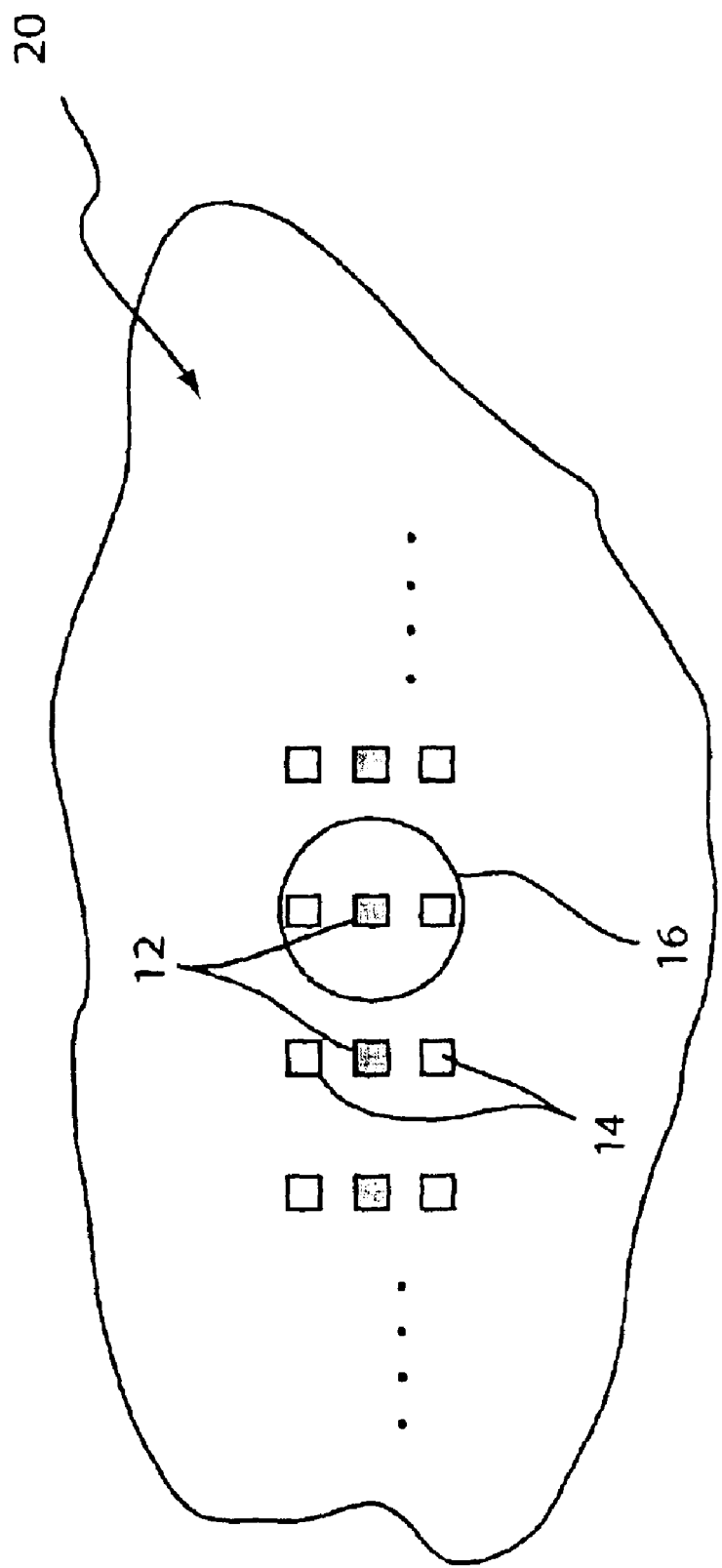
FIG. 1(c) is an axial view of a one-dimensional integrated source and detector array, wherein more than one light source is associated with a given detector, according to the present invention.

FIGS. 1(a), 1(b) and 1(c) show exemplary integrated photodetector and light source arrays according to the present invention. In FIG. 1(a) a two-dimensional array 10 of integrated photodetectors 12 and light sources 14 is shown, each photodetector having a light source associated therewith as shown by circle 16. The individual photodetectors 12 may be any practical opto-electonic photosensitive device small enough to provide the desired image resolution, such as CMOS photodiodes, as is commonly understood in the art. The light sources 14 are preferably light-emitting diodes or laser diodes, depending on the type of illumination desired. Vertical cavity emitting semiconductor lasers are particularly suitable for this invention because they emit light perpendicular to their substrate and can produce unpolarized light. However, other light emitting devices small enough to fit within the array may be used, whether they are semiconductors, lasers or not, without departing from the principles of the invention.

In FIG. 1(b) a one-dimensional integrated array 18 is shown where each photodetector 12 has only one light source 14 associated with it, as in FIG. 1(a). However, there may be applications which call for two or more light sources 14 associated with a single photodetector 12 in an integrated array 20, as shown in FIG. 1(c).

Figure 2:
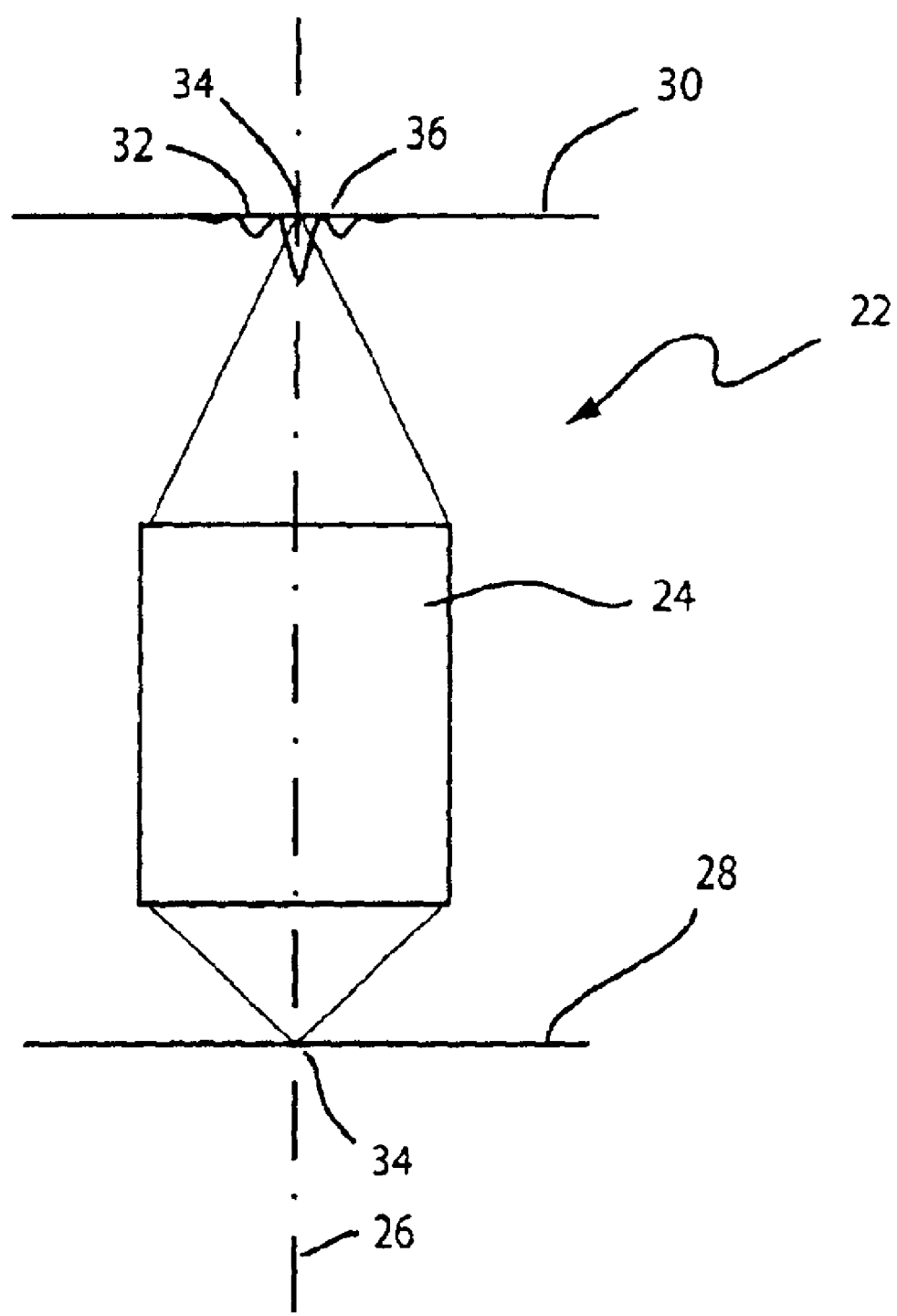
FIG. 2 is a side view and intensity-distribution diagram of an imaging system employing an integrated source and detector array in accordance with the present invention, wherein both the source and the detector lie within a predetermined portion of the Airy pattern of the point response of an imaging system.

Turning to FIG. 2, a first embodiment 22 of a one-dimensional integrated source and detector array epi-illumination system takes advantage of the diffraction-limited point response function of an optical system to provide both illumination and detection of the light at a point on an object to be imaged. An optical system 24 has an optical axis 26, an object plane 28 and an image plane 30. The optical system may be a single or multiple element system, a refractive element system, a reflective element system, a diffractive element system, or some combination of the foregoing, as appropriate for the particular application. In any case, the optical system produces an image 32 at the image plane of a point 34 on the object plane, the image of the point representing the impulse (point) response, or point spread function ("PSF"), of the optical system. The PSF will depend on the wavelength, the aperture of the optical system and the aberrations of the optical system. To the extent the system can be corrected to render the aberrations insignificant, the image will be effectively diffraction limited. In the case of a circularly symmetric aperture, the PSF will then be an Airy pattern, a two-dimensional cross section of which is shown as image 32 in FIG. 2. The source 34 and detector 36 can be positioned so that the central lobe 38 of the PSF covers both the source and the detector, provided that both the source and the detector are small enough, without spreading a significant amount of energy into an adjacent source and detector pair. In this manner, the source and detector act as a single point to the optics.

While this first embodiment does not provide optimal light efficiency, it is simple, compact, and straightforward to manufacture. It can be implemented with either a one-dimensional array, as shown in FIG. 1(b) or a two dimensional array, as shown in FIG. 1(a). To increase light efficiency, multiple detectors surrounding the light source within the central lobe of the image could be used. Also, the optical system can be designed to have desired aberrations so as to produce a non-symmetric PSF and maximize the light irradiating the detector area. As will be understood by a person skilled in the art, there are various ways of accomplishing this, including, for example, forming lenses with aspherical surfaces and decentering the elements of the optical system.

Figure 3:
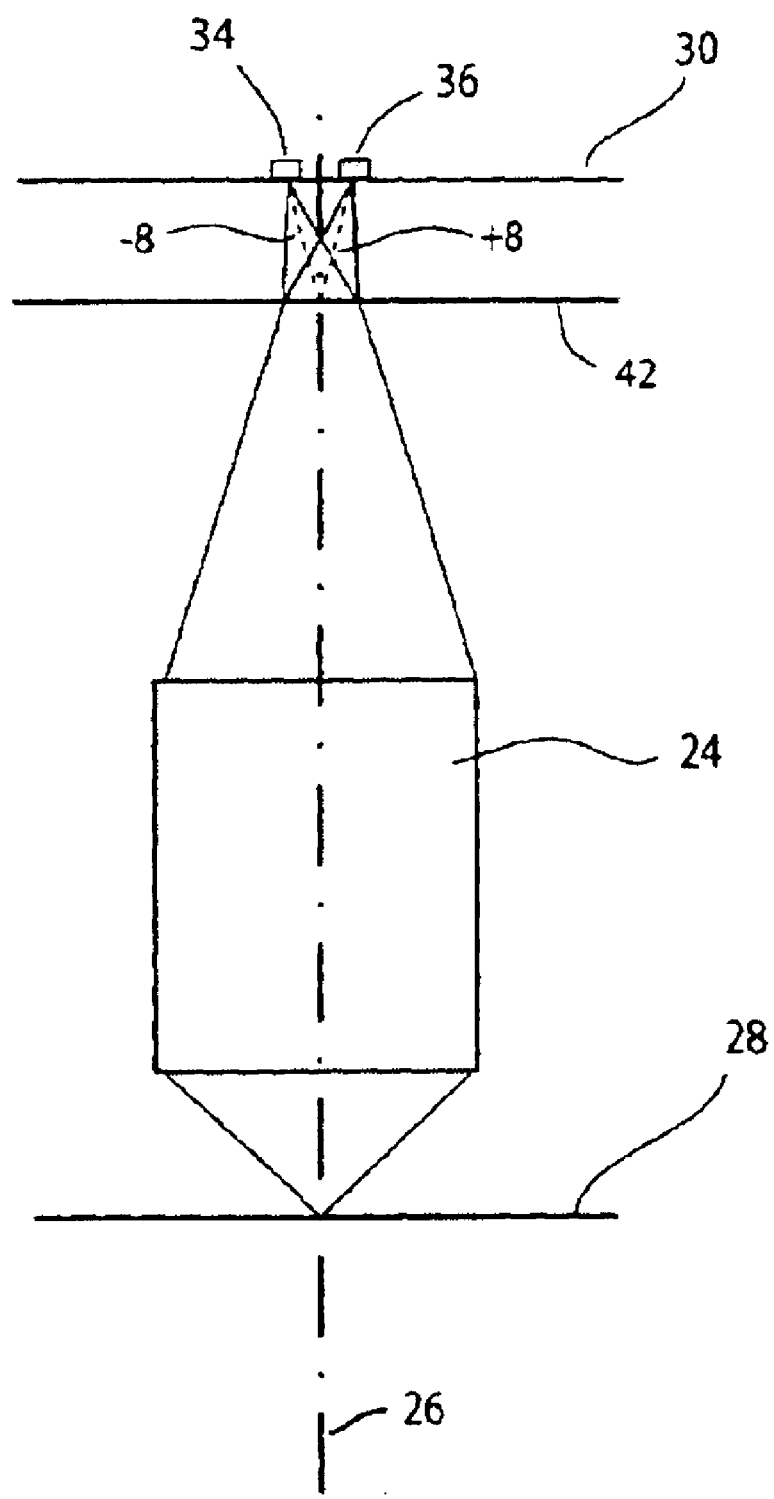
FIG. 3 a side view and ray trace diagram of an imaging system employing an integrated source and detector array according to the present invention, wherein a diffractive element is employed to produce conjugate points in image space.

A second embodiment 40 of a one-dimensional integrated source and detector array illumination system, shown in FIG. 3, uses a diffraction element to separate the illumination light from the image light at image plane. As in FIG. 2, the system has an optical system 24, with an optical axis 26, and object plane 28 and an image plane 30. A source 34 and detector 36, which are part of a linear array, are preferably disposed symmetrically about the optical axis at the image plane 30. In this case, a diffraction element 42 is also included. The diffraction element, which may be, for example, a grating or hologram, is preferably optimized to maximize the diffraction efficiency of the +δ and −δ first diffraction orders, while minimizing the diffraction efficiency of all other orders. The source and detector are then placed in the respective paths of those two orders, that is, coupled thereto, so that the source and detector are conjugate to one another and thereby provide optimum use of light.

Figure 4:
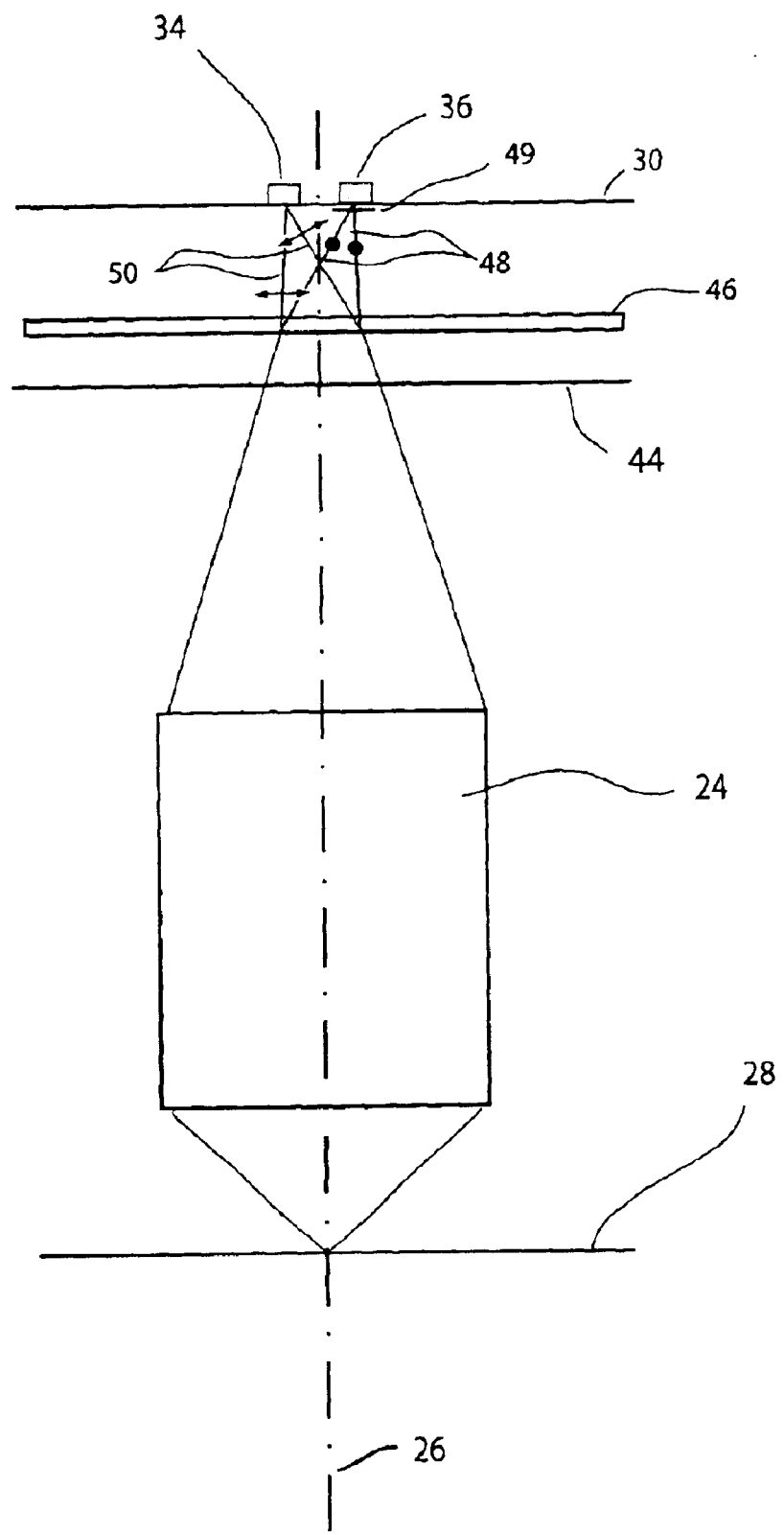
FIG. 4 is a side view and ray trace diagram of an imaging system employing an integrated source and detector array according to the present invention, wherein a Wollaston prism is employed to produce conjugate points in image space.

In a third embodiment, conjugate points on the image plane can be formed by a Wollaston prism. As shown in FIG. 4, a quarter wave plate 44 may be placed in front of a Wollaston prism 46 at an angle to the two eigenaxes thereof so that the optical pathway is split into two pathways having respectively orthogonal polarizations and respective angles of refraction, as indicated by the dot 48 and arrow 50. This requires either that the source 36 produce light that is linearly polarized in the direction represented by dots 48, or that a linear polarizer 49 be used to produce such linear polarization. The source light is then circularly polarized in one direction by the quarter wave plate, circularly polarized in the opposite direction upon reflection from the object, then linearly polarized in the direction of arrows 50 by the quarter wave plate. Thus, this arrangement creates two conjugate points in the image plane that correspond to a light source 34 and photodetector 36, respectively.

Figure 5:
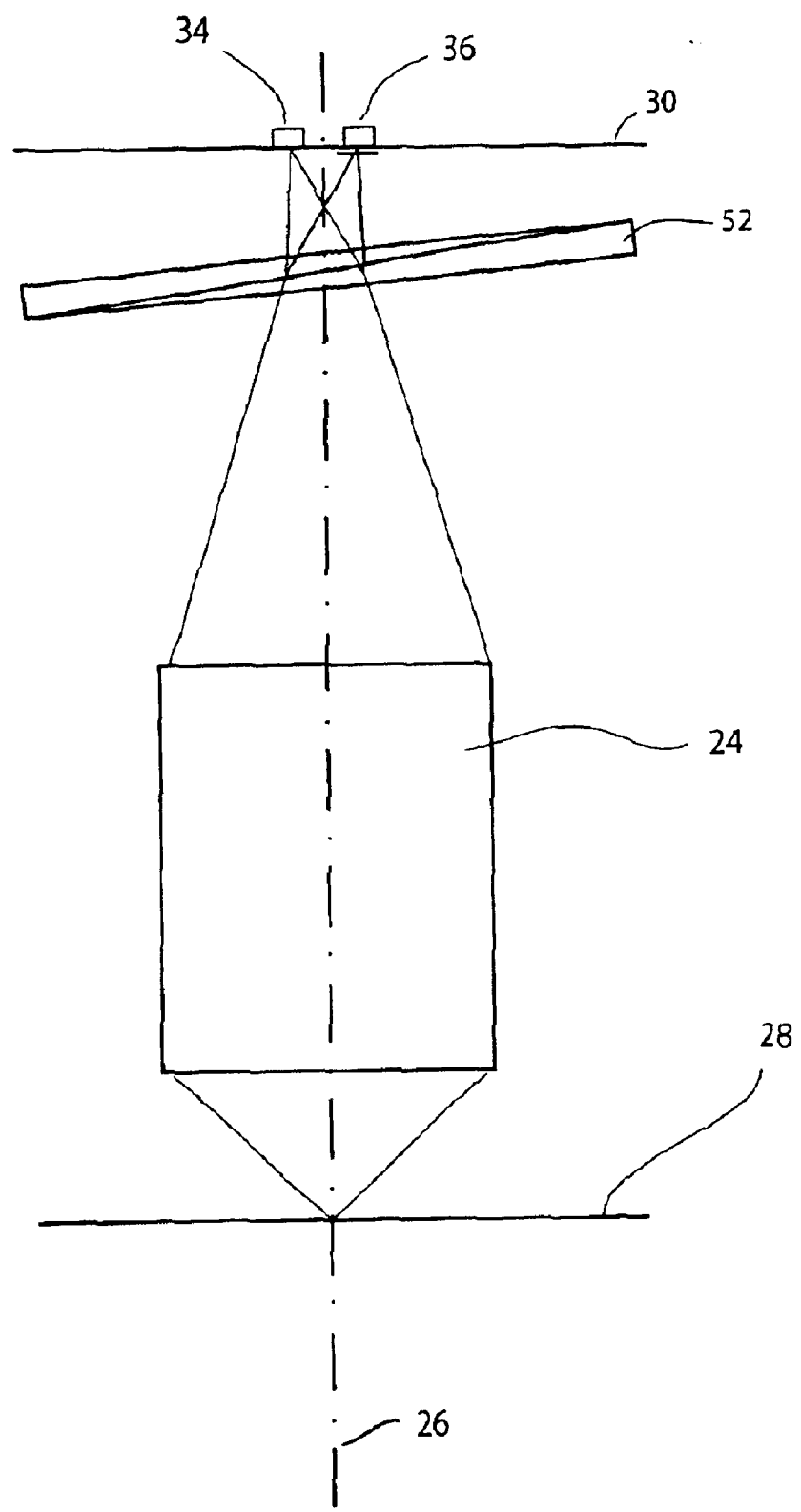
FIG. 5 is a side view and ray trace diagram of a fluorescence imaging system employing an integrated source and detector array according to the present invention, wherein a direct view prism is employed to produce conjugate points in image space.

In the case of fluorescence imaging, the dispersive qualities of optical elements can be employed to produce conjugate points in image space. In fluorescence imaging the light source has a first wavelength, or more generally a first energy spectrum, that excites the object to fluoresce and thereby emit light at a different wavelength, or more generally a different energy spectrum. In this case, the light sources 34 emit light at one wavelength, typically an ultraviolet wavelength, and the photo-detectors 36 either are sensitive to a different wavelength or associated with filters that limit the spectrum received thereby to a different wavelength. For example, a direct vision prism 52 splits the optical pathway 54 into two branches corresponding to the excitation and fluorescence emission wavelengths, respectively, as shown in the embodiment of FIG. 5. Thus, it creates two conjugate points in the image plane that correspond to a light source 34 that emits light at one wavelength and photo-detector 36 that is responsive to another wavelength. A number of detectors can be used as well to detect light corresponding to a corresponding number of different wavelengths, such as red, green and blue light.

Generally, any device that conjugates spatially-separated points corresponding respectively to light sources and photo-detectors in image space for epi-illumination may be used without departing from the principles of the invention.

While the light source array and photodetector array are ordinarily coplanar for producing critical illumination, they can be disposed in axially separate planes. This may be desirable, for example, to compensate for axial dispersion in fluorescence imaging. In that case, the array of light sources is placed at the image plane for the excitation light, while the photodetector array is placed at the image plane of the wavelength of light to be detected.

Figure 6:
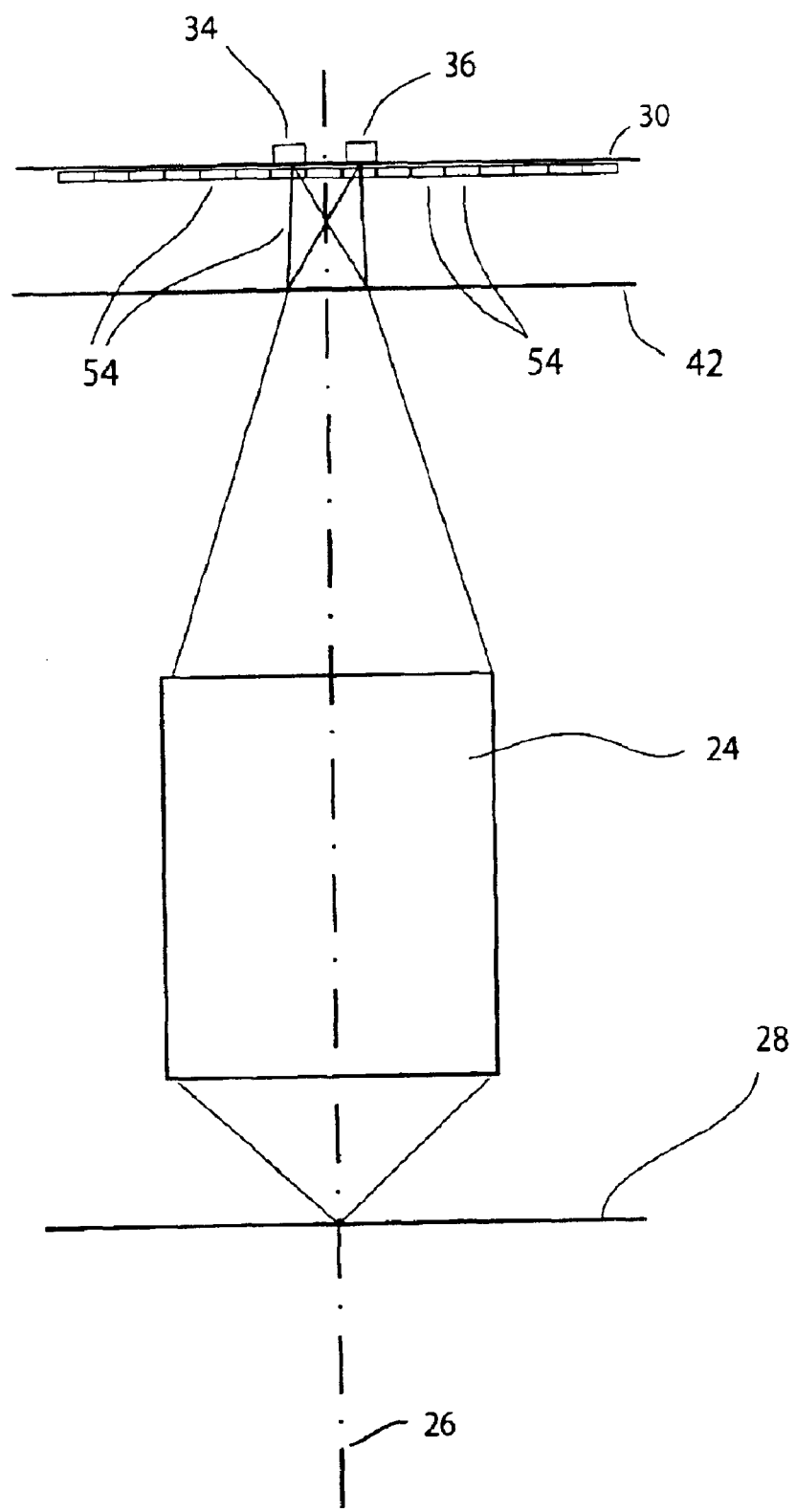
FIG. 6 is a side view and ray trace diagram of a confocal imaging system employing an integrated source and detector array according to the present invention, wherein a diffractive element is employed to produce conjugate points in image space.

The embodiments of FIGS. 2–5 can also be used in a confocal mode, as shown with respect to the second embodiment in FIG. 6. In this case, a stop is provided with an array of pinhole apertures 54, one for each detector 34, and with conjugate apertures for the light sources 36. The image of each source, which is essentially a point source, is conjugated with the object plane. After reflection from the object, the light is imaged onto a corresponding pinhole aperture 54. The amount of light that passes through the aperture is closely related to the focus of the image and can be used to gauge the distance of the object surface to the focal position. If the object and the light beam are then moved with respect to one another, the profile of the object can thereby be determined. By providing a linear array of source-detector pairs and scanning the object in a direction perpendicular to the array, rapid confocal scanning can be achieved. Depending on the sources and detectors, the exit apertures of the sources and the active areas of the detectors may be small enough to eliminate the need for the array of pinhole apertures 54.

Figure 7:
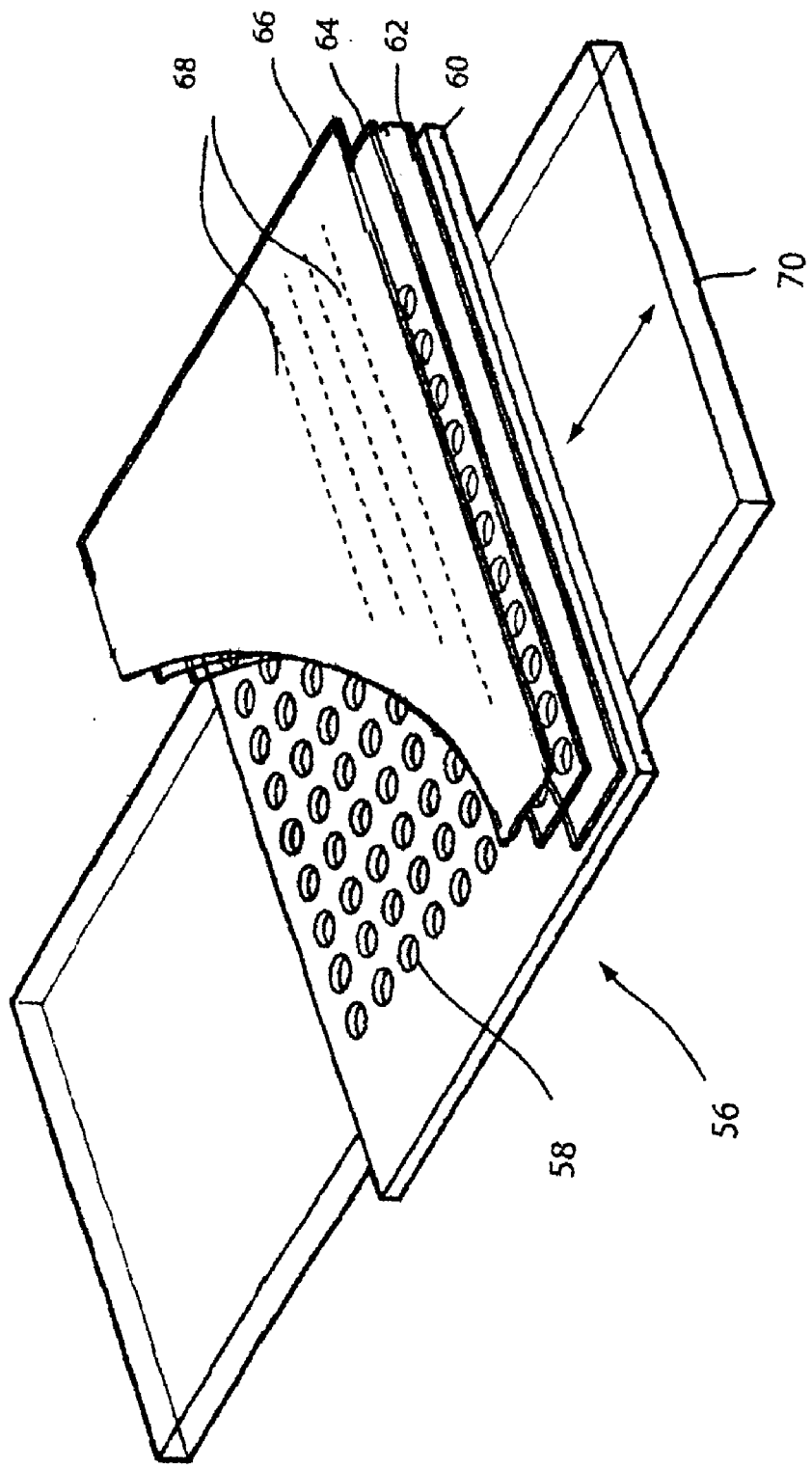
FIG. 7 is a perspective view of an illustrative array microscope incorporating an integrated source and detector array according to the present invention.

The embodiments of FIGS. 2–6 can be employed in a miniaturized microscope array, or more specifically an array microscope, as shown in FIG. 7. An exemplary embodiment of an array microscope 56 comprises pluralities of lenses 58, corresponding to individual microscope elements, disposed on respective lens plates 60, 62 and 64, which are stacked along the optical axes of the microscope elements. An array 66 of linear, integrated source-detector arrays 68 resides above the last lens plate. The array microscope 66 is typically employed to scan a sample on a carriage 70 as the carriage is moved with respect to the array or vice versa. Each set of corresponding lenses 58 and respective lens plates 60, 62 and 64 images a section of the object onto a corresponding source-detector array 58 as the object moves by on the carriage 70.

Since the individual elements of a light source array may vary in their radiance characteristics, and individual elements of a detector array may vary in their offset and responsivity characteristics, the present invention contemplates several approaches to equalization of image brightness for a uniform object irradiance characteristic. These approaches may complement one another or be used in the alternative. In general, one approach is to process digitally the numerical representations of image intensity so as to compensate mathematically for variations in dynamic range and offset of the detector outputs based on stored knowledge of the individual response characteristics. Another approach is to adjust the dynamic range of the detectors by adjusting either the powers of their respective light sources or the gains of their respective amplifiers, or both, and to compensate for different detector offsets by adjusting the offsets of their respective amplifiers or A/D converters, or both.

Figure 8:
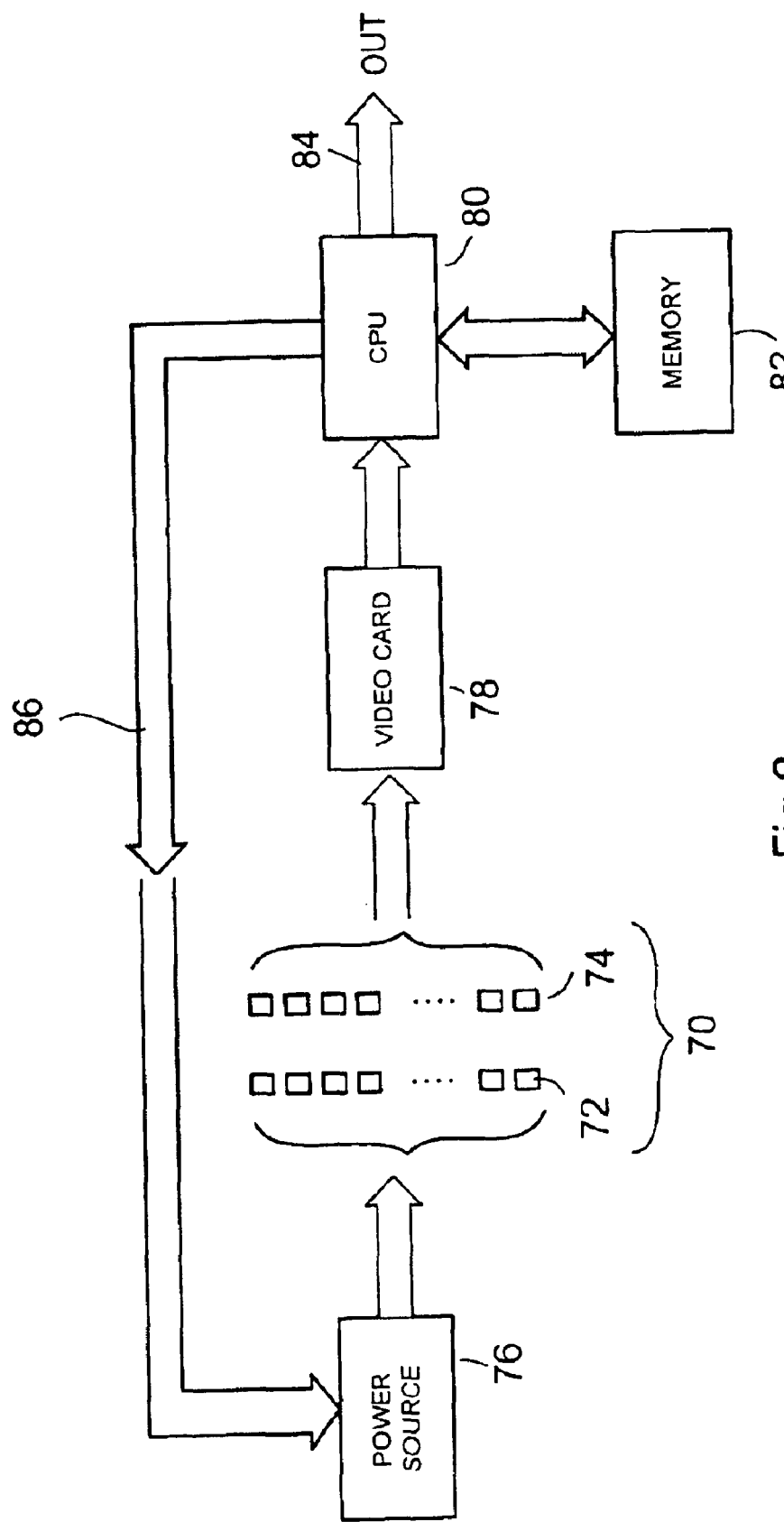
FIG. 8 is a block diagram of a first embodiment of a microscope array system including a circuit to equalize the outputs of detectors for a given irradiance illumination, in this case by adjusting the power applied to respective light sources and computationally correcting the measured image brightness values.

Referring to FIG. 8, one approach to equalization is to selectively add correction values to image brightness values mapped to an image produced by a microscope array. In FIG. 8, the microscope array is represented schematically at 70 by a plurality of light sources 72 and corresponding light detectors 74, the presence of epi-illumination and imaging optics as described above being implied. Power is supplied to the light sources 72 by a power supply 76, and the analog signal outputs from the detectors are provided to a video card 78, which samples and converts those signals to digital representations of brightness values mapped to image pixels, as is well known in the art. The power supply may be adapted to direct a selected amount of power to respective individual light sources 72. The detector brightness values are provided to a digital processor 80, which may perform processing operations on those values, store those values in a memory 82, provide those values to an output interface 84, perform some combination of the foregoing three functions, or perform some other function for which the processor is constructed or programmed.

In the case where substantially the same amount of power is provided to all, or a known set, of the light sources 72, and an object of uniform radiance response is illuminated and imaged, the processor 80 is adapted to compute and add to selected brightness values corresponding correction values that produce a resulting image of uniform brightness. The amount of power may be applied to the sources may be fixed or set by the processor via bus 86 between the power supply 76 and the processor 80. What is meant by an object of uniform radiance response is a two dimensional surface whose reflectance or transmittance is essentially the same over the entire field of view of the array microscope. In addition, or as an alternative, to correcting the brightness values, the processor 80 may be architecturally adapted or programmed to provide a first set of correction signals to the power supply via bus 86 so as to adjust the individual radiances for respective sources 72 to achieve equalization.

The correction values may correct for variations in gain or offset of the detectors and their associated electronics, and for variations in radiance of the sources. The processor may either compute the correction required for each brightness value produced by a detector based on a mathematical model of the response of the detector, or it may utilize a look-up table of calibrated or pre-computed correction values, as is well understood in the art. In addition, or in the alternative, the processor may use correction values to provide a desired non-linear brightness response to the detected radiance from the object, for example, to compress a large dynamic range in radiance logarithmically.

Figure 9:
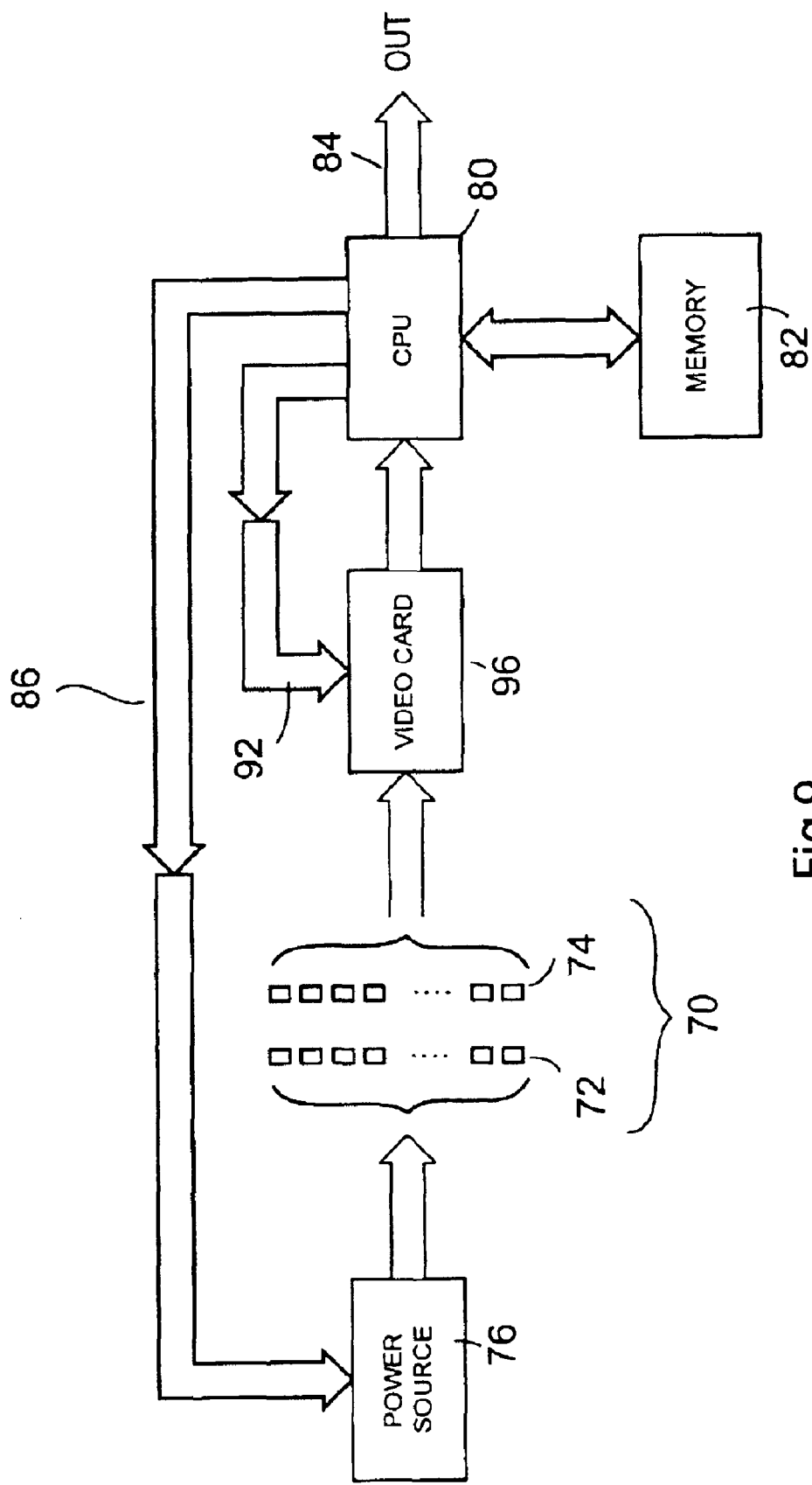
FIG. 9 is a block diagram of a second embodiment of a microscope array system including a circuit to equalize the outputs of detectors for a given irradiance illumination, in this case by adjusting the power applied to respective light sources and providing gain and offset values to a video board.

Turning to FIG. 9, a video board 90 may be employed which accepts a correction signal input so as to adjust the gain and offset of the electronics that convert the analog output of the detectors to a digital value representative of image pixel brightness. The processor 80 may be architecturally adapted or programmed to provide a first set of correction signals to the power supply via bus 86 so as to adjust the radiances for respective sources 72, or to provide sets of gain or offset correction signals to the video card 90 via bus 92, or some combination of the foregoing, in response to the brightness values produced by the video card to equalize those brightness values for an object of uniform radiance response. The video card 90, which contains both detector amplifiers and A/D converters, may be architecturally adapted or programmed to effectuate the required gain and offset corrections, for example by the use of discrete logic or a field-programmable gate array and digital-to-analog converters, by converting the digital commands of the processor 80 to a set of analog signals to the amplifiers to set their individual gains and to the A/D converters to set their offset.

Figure 10:
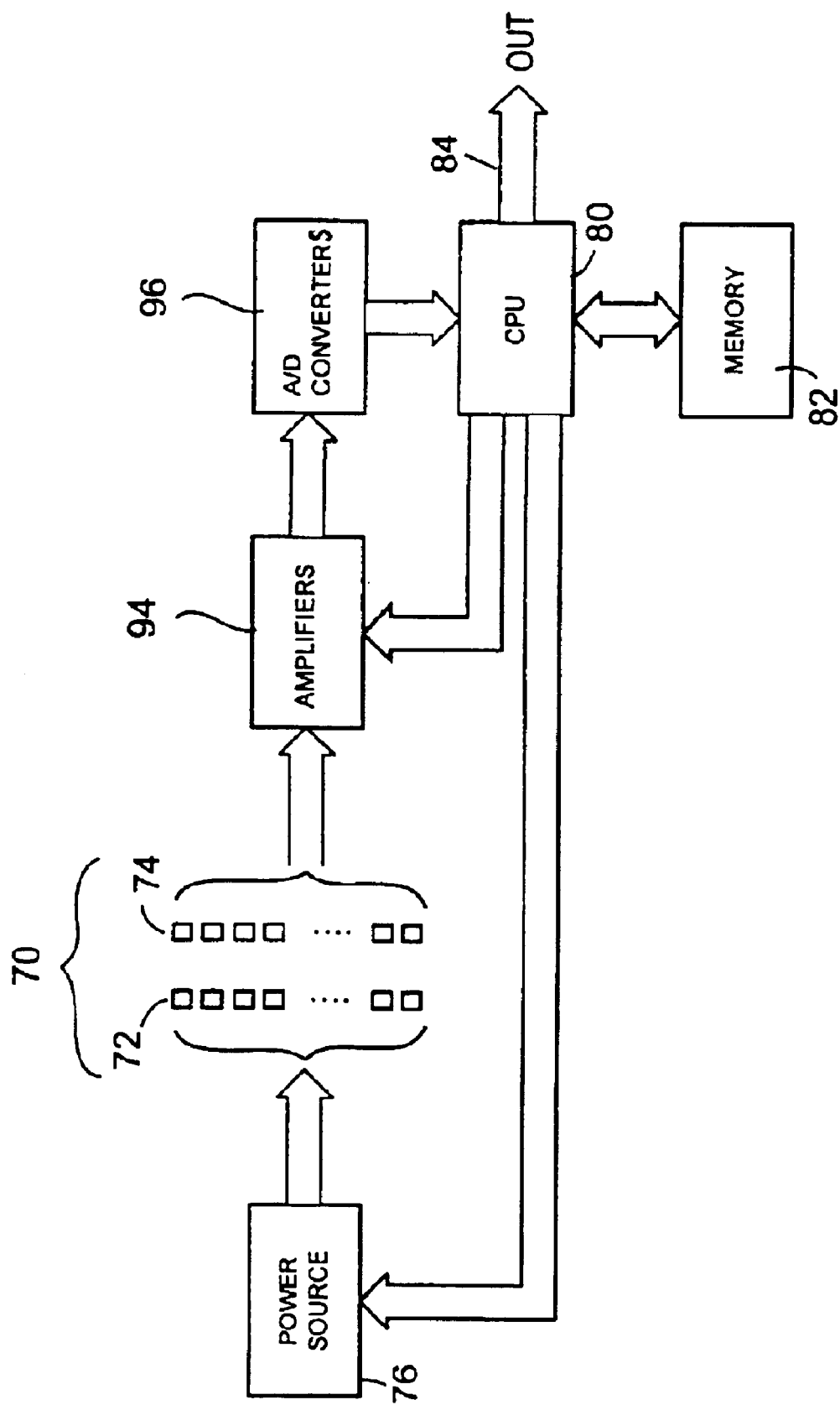
FIG. 10 is a block diagram of a third embodiment of a microscope array system including the equalization of the outputs of detectors for a given irradiance illumination, in this case by adjusting the power applied to respective light sources and modifying the gain and offset of individual amplifiers associated with each detector of a detector array.

In FIG. 10, a set of amplifiers 94 and a set of A/D converters 96, corresponding and responsive to respective detectors 74, are provided instead of a video card, the amplifiers providing analog signal conditioning and gain and the D/A converters being adapted to sample and digitize the outputs of the amplifiers so as to provide digital words representative of brightness values. In this case, the correction signals more directly act on the amplifiers 94 via bus 93 and A/D converters 96, via bus 95, the amplifiers and A/D converters having their own digital-to-analog conversion circuitry.

In one embodiment, there is an amplifier for each detector, that is, for each pixel of the image that is produced, which requires large scale integration of amplifiers with the detectors. In another embodiment the requirement for so many amplifiers is reduced by taking advantage of the fact that the intensity signals generated by the individual detectors are shifted out of a CCD array serially, row of detectors-by row. Only one amplifier for each row is needed in this embodiment where the gain of each amplifier is synchronously set for each detector as the detector's signal passes there through.

Method flow charts for processor operation are shown in FIGS. 11(a)–11(d). The processor may be architecturally adapted to carry out the operations of the flow charts, or may be programmed to carry out these methods. In either case, it is to be understood that these are exemplary functions and that variations on the steps shown in the flow charts, and even other functions, may be implemented by the processor without departing from the principles of the invention.

Figure 11A:
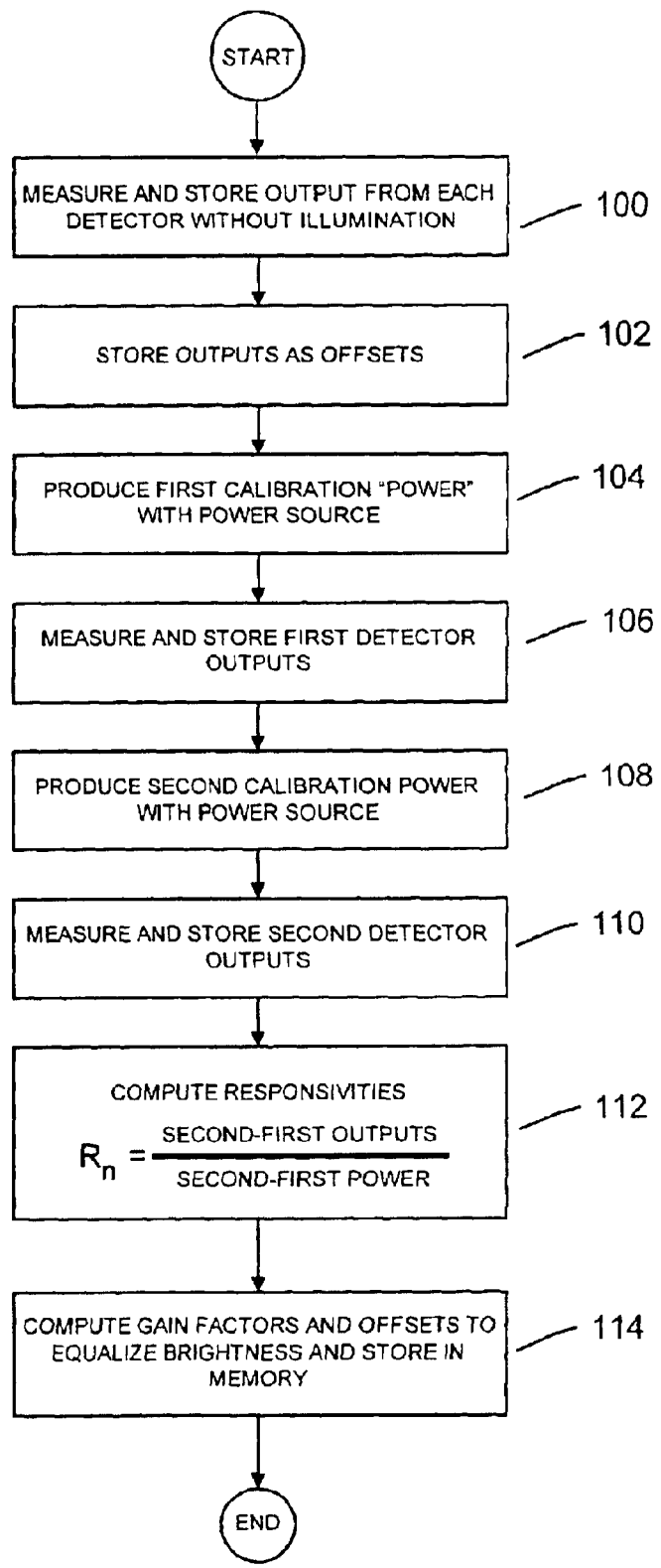
FIG. 11(a) is a flow chart of a method for computing and storing brightness equalization values for calibration.

Referring first to FIG. 11(a), in a preferred embodiment, before an actual specimen is scanned, in step 100 the outputs of the detectors 74 are measured without any illumination and those outputs are stored, in step 102, as detector offset values. In step 104, a first known amount of calibration power $\Phi_{1n}$ is supplied to the light sources 72, and in step 106 the outputs of the detectors 74 are stored as first detector calibration values $C_{1n}$. In step 108, a second known amount of calibration power $\Phi_{2n}$ is supplied to the light sources 72, and in step 110 the outputs of the detectors 74 are stored as second detector calibration values $C_{2n}$. Based on the first and second calibration powers and corresponding first and second calibration values, the responsivities of the array of detectors are computed in step 112 as follows:

$$R_n = (C_{2n} - C_{1n})/(\Phi_{2n} - \Phi_{1n})$$

where n indicates a plurality of responsivity values corresponding to respective detectors in the array 74, and responsivity is used loosely to refer to the detector electrical response to the electrical power input to its corresponding light source, rather than the radiant flux input to the detector itself, it being recognized that not all the electrical power input to a source will become radiant power received by the corresponding detector. Based on these responsivity and offset measurements, gain factor and offset correction values are determined in step 114.

Figure 11B:
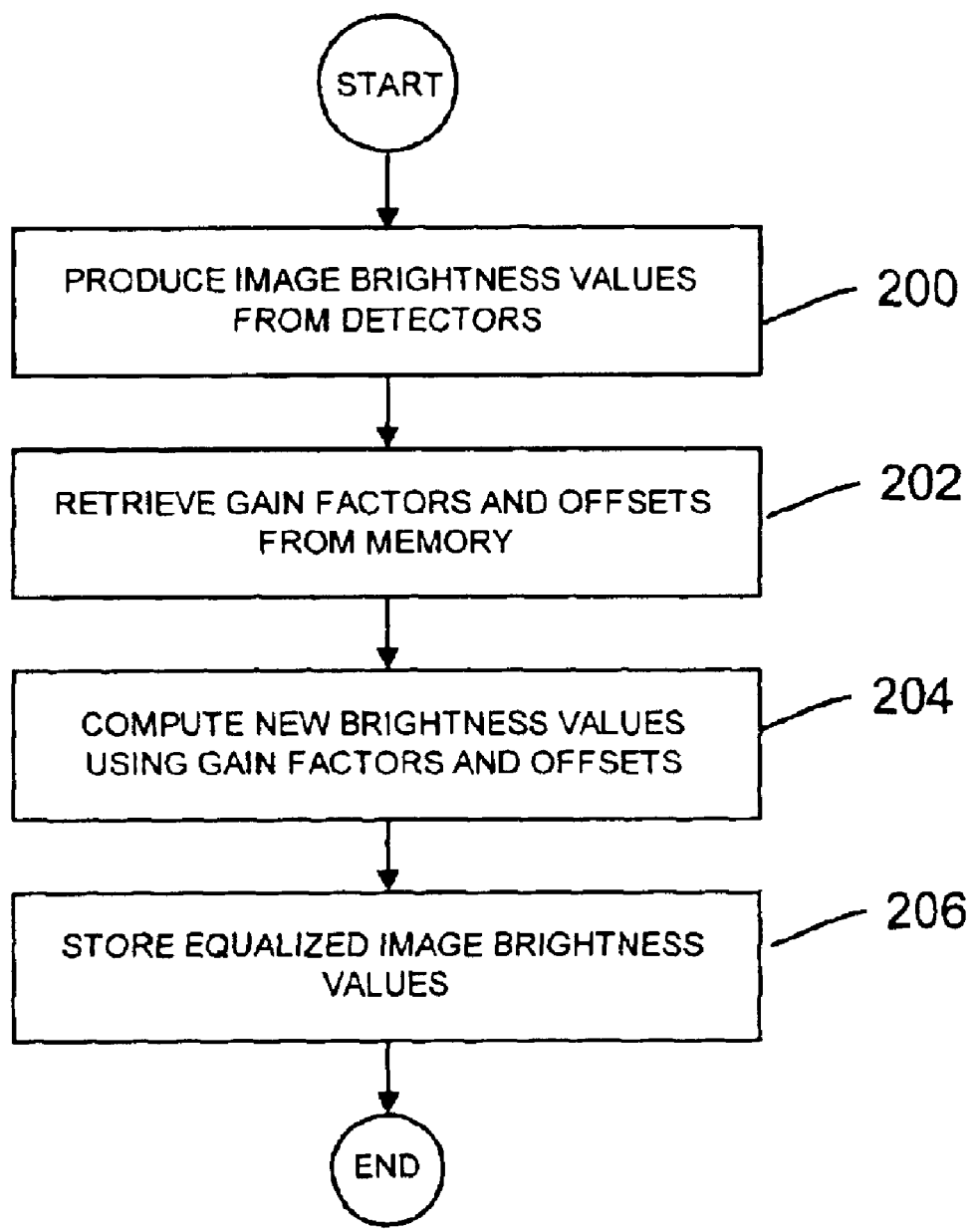
FIG. 11(b) is a flow chart of a method for equalizing image brightness by computationally correcting the measured image brightness values.

While the flow chart in FIG. 11(a) shows preferred calibration steps, the flow chart in FIG. 11(b) show the method that would preferably be used to equalize a system by correcting measured brightness values. Thus, in step 200, when an object is scanned image brightness values are produced by the video card 78. In step 202, the processor retrieves stored gain and offset correction values, found in the manner described for FIG. 11(a). The processor then computes new brightness values in step 204 by multiplying the brightness value by a correction factor and adding an offset correction value, which may be negative. In step 206, the new image brightness values thus computed are then stored as an equalized image.

Figure 11C:
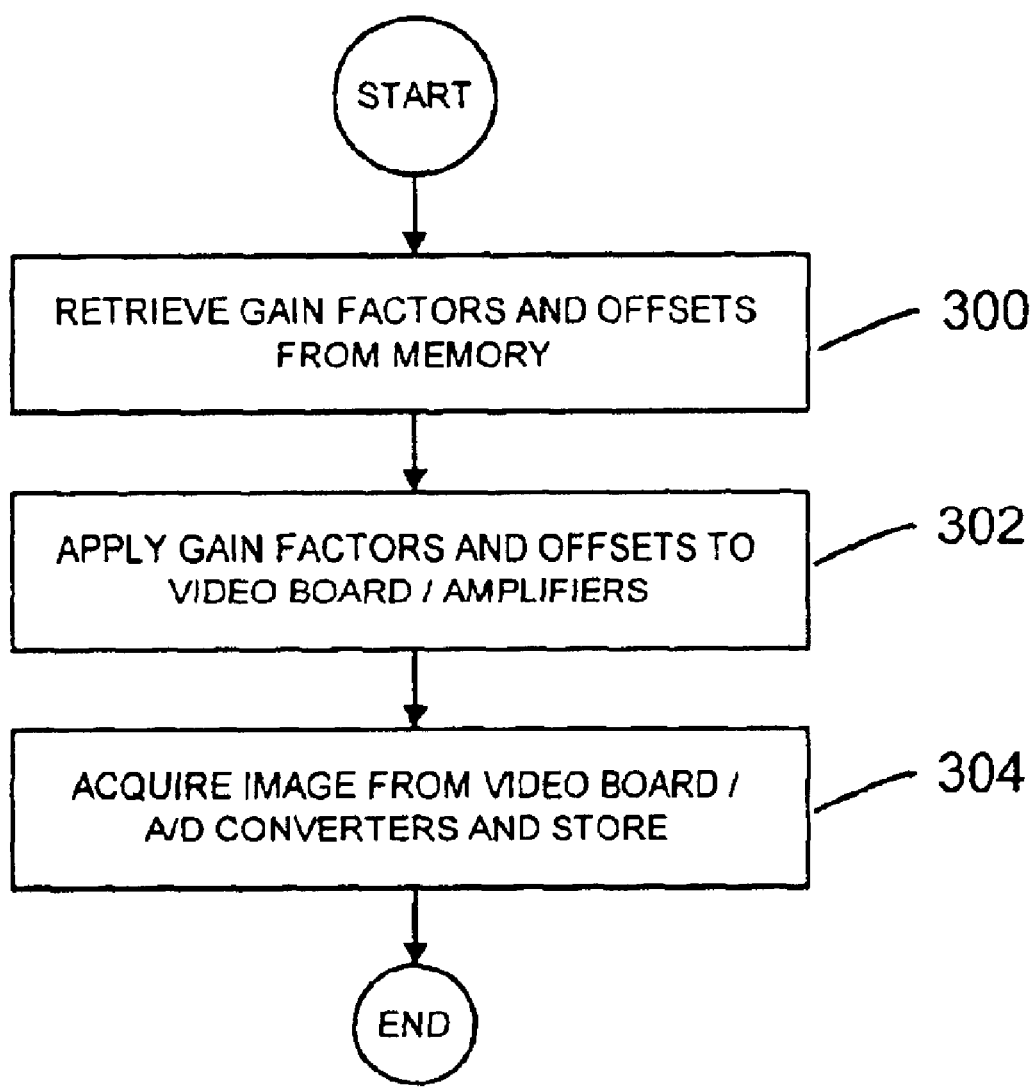
FIG. 11(c) is a flow chart of a method for equalizing image brightness by applying gain factors and DC offset corrections to a video board or set of amplifiers.

FIG. 11(c) illustrates a method for equalization where a video card 90 or a set of amplifiers 94 and corresponding A/D converters 96 is adapted to receive digital gain and offset correction values. In this case, once calibration has been accomplished in accordance with the process represented by FIG. 11(a), the stored gain and offset correction values are retrieved in step 300 and applied to the video card 90 or amplifiers 94 and A/D converters 96 in step 302. Where a plurality of amplifiers and respective A/D converters corresponding to each detector are provided, the gain and offset values are set in parallel. Where only one amplifier is provide for each row of detectors is provided, the gain adjustments are made dynamically, in synchronism with the serial readout of intensity values produced by the detectors. A specimen is then scanned and its image is captured by the detectors 74. The outputs of the detectors are then acquired in step 304 so as to provide an equalized image.

Figure 11D:
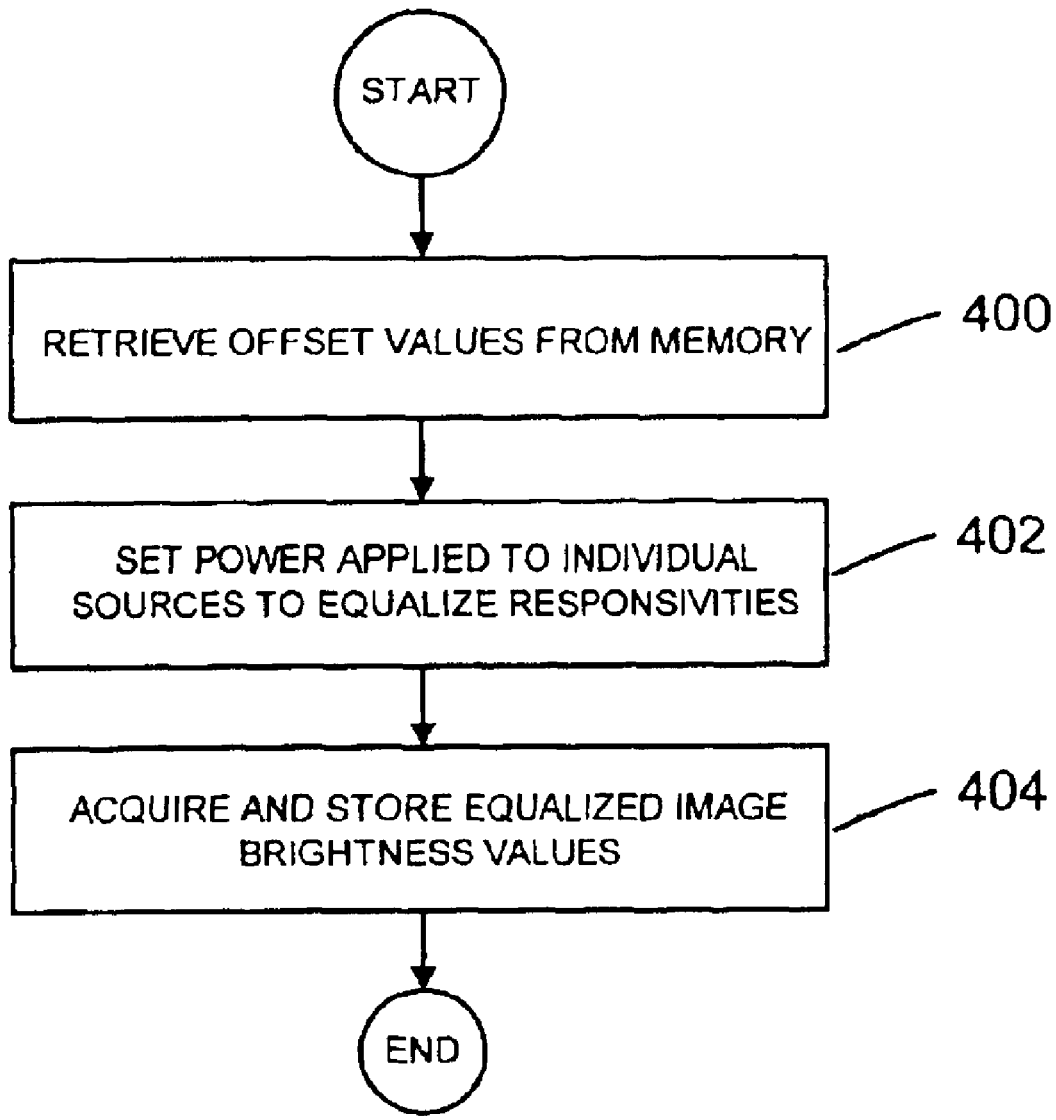
FIG. 11(d) is a flow chart of a method for equalizing image brightness by adjusting the power applied to individual illumination light sources.

FIG. 11(d) illustrates a method of equalization by adjusting the power supplied to the light sources. Thus, in step 400, the stored gain and offset correction values are retrieved. These values are then used to set the individual powers supplied to respective light sources 72, in step 402, to equalize the detector responsivities. Lastly, a specimen is scanned with the powers set, and the brightness values of the image are acquired and stored in step 404. It is to be understood that, while the processes of FIGS. 11(b), 11(c) and 11(d) are shown separately, in accordance with the invention they may be use in any practical and convenient combination to provide equalized images.

While the equalization system described above was first described in the context of an epi-illumination system with integrated sources and detectors because it is particularly useful in such a system, the principles of the equalization system are also adaptable to a an epi-illumination imaging system without integrated sources and detectors, a trans-illumination imaging system.

Figure 12A:
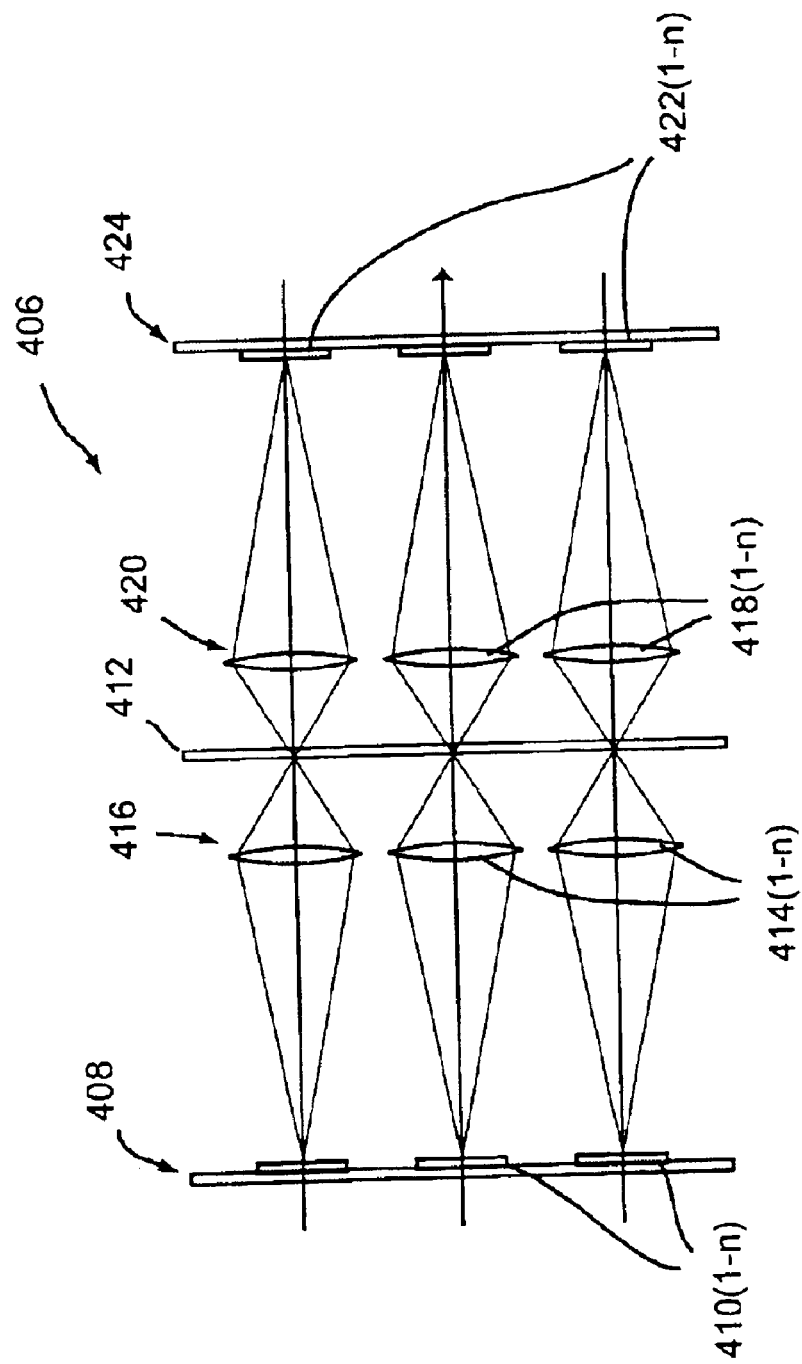
FIG. 12(a) is a side view and ray trace diagram of an exemplary embodiment of a multi-axis, trans-illumination, multi-axis imaging system in which the equalization features of the present invention may be used.

FIG. 12(a) shows an exemplary embodiment of a multi-axis, trans-illumination, multi-axis imaging system 406. In this system an array 408 of independently-powered light sources 410 (1–n) is provided. Each of the sources is imaged to a corresponding point on the specimen 412 by a respective lens 414 (1–n) of condenser array 416. The illumination light is transmitted through each respective point, with varying respective degrees of absorption, and is thereafter imaged by respective lenses 418 (1–n) of a microscope lens array 420 to respective detectors 422 (1–n) of microscope detector array 424. For convenience, in FIG. 12(*a*) the vertical extend of the components of this system have been shortened, it being understood that much larger arrays of sources, lenses and detectors would be used in practice. In this embodiment, the power to the individual sources may be adjusted individually, just as described above with respect to epi-illumination, to equalize the outputs of the detectors and associated electronics.

Figure 12B:
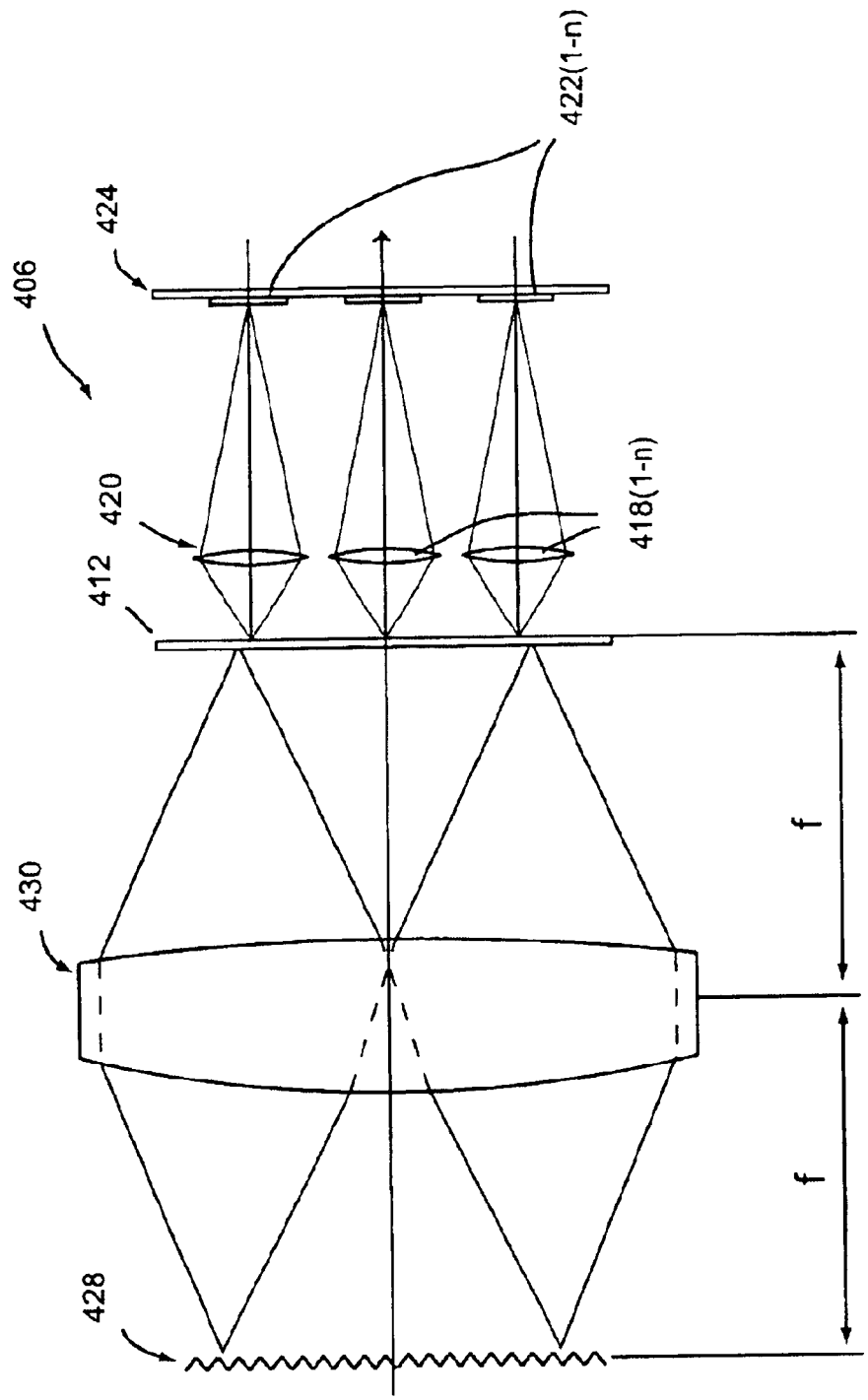
FIG. 12(b) is a side view and ray trace diagram of an exemplary embodiment of a single-axis, trans-illumination, multi-axis imaging system in which the equalization features of the present invention may be used.

An exemplary single-axis, trans-illumination, multi-axis imaging system 426 is shown in FIG. 12(*b*). In this embodiment, the imaging side is the same as the imaging side of system 406. However, the illumination side comprises a single, extended source 428, and a telecentric illumination system having a condenser lens 430 with focal length "f". As in FIG. 12(*a*), the vertical extents of the components of the system illustrated by FIG. 12(*b*) have been shortened from what would be used in practice. As can be seen, each point on the specimen 412 is illuminated with a numerical aperture the same as the numerical aperture of the imaging side 406. Various single-axis trans-illumination systems for a multi-axis imaging system are described in copending U.S. patent application Ser. No. 10/191,874, filed Jul. 8, 2002, the entire contents of which are hereby incorporated by reference.

The terms and expressions which have been employed in the foregoing specification are used therein as terms of description and not of limitation, and there is no intention, in the use of such terms and expressions, to exclude equivalents of the features shown and described or portions thereof, it being recognized that the scope of the invention is defined and limited only by the claims which follow.

We claim:

1. An equalization system adopted for use with an imaging system having an array of light detectors, an array of individual light-emitting sources corresponding to respective said light detectors, and an optical system disposed with respect to said array of light-emitting sources so as to illuminate an object with light from said light-emitting sources and image the object on said corresponding light detectors, the equalization system comprising:

a power supply adapted to supply to a plurality of light-emitting sources amounts of power that have definite relative magnitudes with respect to one another;

a signal conditioning circuit for receiving and digitizing output signals from a respective set of said light detectors so as to produce a respective set of output values, said signal conditioning circuit including a set of amplifiers corresponding to said set of the light detectors which apply gain to said output signals prior to digitization thereof; and an equalizer system for equalizing said respective set of output values for a given amount of optical input power supplied to said set of light detectors, said equalizer system being adapted to equalize said set of output values by adjusting the relative amounts of power applied to said light-emitting sources based on said output values so as to adjust the relative amounts of power applied to said light-emitting sources and to provide correction signals to said amplifiers based on said output values so as to equalize said output values for said given amount of input power, and is further adapted to add to one or more of said output values respective error correction values so as to produce new respective values that are substantially equal for said given amount of input power.

* * * * *